US012701821B2

(12) United States Patent (10) Patent No.: US 12,701,821 B2
Moon et al. (45) Date of Patent: Aug. 4, 2026

(54) TRANSFER DEVICE FOR SEMICONDUCTOR LIGHT EMITTING DEVICE AND DISPLAY DEVICE OF SEMICONDUCTOR LIGHT EMITTING DEVICE USING SAME

(71) Applicant: LG ELECTRONICS INC., Seoul (KR)

(72) Inventors: Joonkwon Moon, Seoul (KR); Sungjin Park, Seoul (KR); Taesu Oh, Seoul (KR); Bongseok Choi, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 771 days.

(21) Appl. No.: 18/023,657

(22) PCT Filed: Aug. 27, 2020

(86) PCT No.: PCT/KR2020/011472
§ 371 (c)(1),
(2) Date: Feb. 27, 2023

(87) PCT Pub. No.: WO2022/045394
PCT Pub. Date: Mar. 3, 2022

(65) Prior Publication Data
US 2023/0327047 A1      Oct. 12, 2023

(51) Int. Cl.
*H10H 20/01*        (2025.01)
*B23K 26/066*        (2014.01)
(Continued)

(52) U.S. Cl.
CPC ......... *H10H 20/01* (2025.01); *B23K 26/0661* (2013.01); *B23K 26/57* (2015.10); *H10H 29/142* (2025.01)

(58) Field of Classification Search
CPC .. H10H 20/01; H10H 29/142; B23K 26/0661; B23K 26/57; H10P 34/42; H10P 72/00
See application file for complete search history.

(56) References Cited

U.S. PATENT DOCUMENTS

2009/0233185 A1*   9/2009   Oh ............................ G03F 1/38
                                                            430/5
2011/0133216 A1    6/2011   Sugawara
                            (Continued)

FOREIGN PATENT DOCUMENTS

JP        2011-124311 A    6/2011
KR        10-1414805 B1    7/2014
                    (Continued)

OTHER PUBLICATIONS

International Search Report for PCT/KR2020/011472 mailed on May 26, 2021.

*Primary Examiner* — Ratisha Mehta
(74) *Attorney, Agent, or Firm* — Birch, Stewart, Kolasch & Birch, LLP

(57) ABSTRACT

Embodiments relate to a transfer device of a semiconductor light emitting device and a display device of a semiconductor light emitting device using the same.
A semiconductor light emitting device transfer device according to an embodiment can include a line beam laser generating device and a through-type glass mask disposed on a semiconductor substrate including a predetermined semiconductor light emitting device.
The line beam laser 210 generated by the line beam laser generator can pass through the through-type glass mask to selectively transfer the semiconductor light emitting device on the semiconductor substrate onto a predetermined panel substrate.

16 Claims, 13 Drawing Sheets

(51) Int. Cl.
   _B23K 26/57_ (2014.01)
   _H10H 29/14_ (2025.01)

(56) References Cited

U.S. PATENT DOCUMENTS

| | | | |
|---|---|---|---|
| 2014/0133027 A1* | 5/2014 | Jang ..................... | G02B 5/3058 |
| | | | 359/485.03 |
| 2016/0099163 A1* | 4/2016 | Nasu ..................... | C04B 37/021 |
| | | | 156/89.16 |
| 2017/0162552 A1 | 6/2017 | Thompson | |
| 2020/0243358 A1* | 7/2020 | Kwag ............... | H01L 21/67144 |
| 2020/0313035 A1* | 10/2020 | Lee ......................... | H01L 24/92 |
| 2020/0357779 A1* | 11/2020 | Kwag ................... | H01L 25/167 |

FOREIGN PATENT DOCUMENTS

| | | | |
|---|---|---|---|
| KR | 10-2014-0114608 A | 9/2014 | |
| KR | 10-2019-0070633 A | 6/2019 | |
| KR | 10-2020-0049946 A | 5/2020 | |
| WO | WO 2017/099905 A1 | 6/2017 | |

* cited by examiner

【FIG. 1】
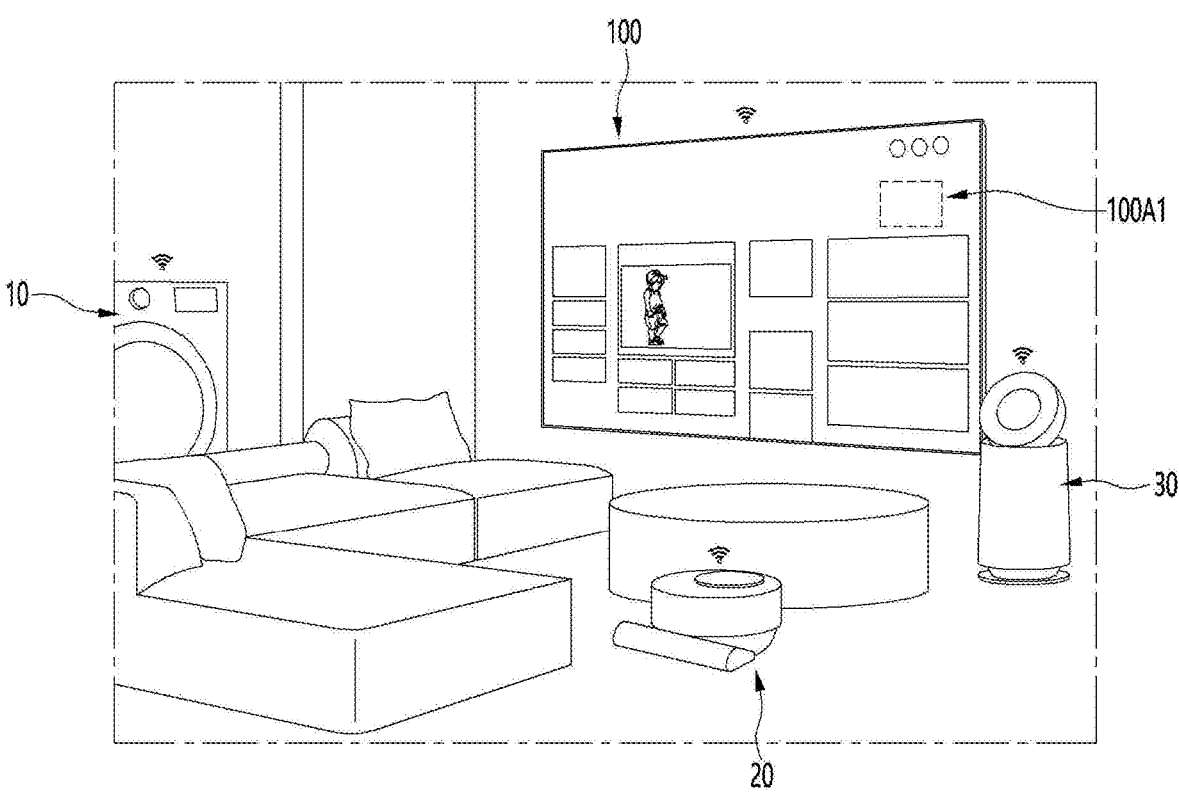

【FIG. 2】
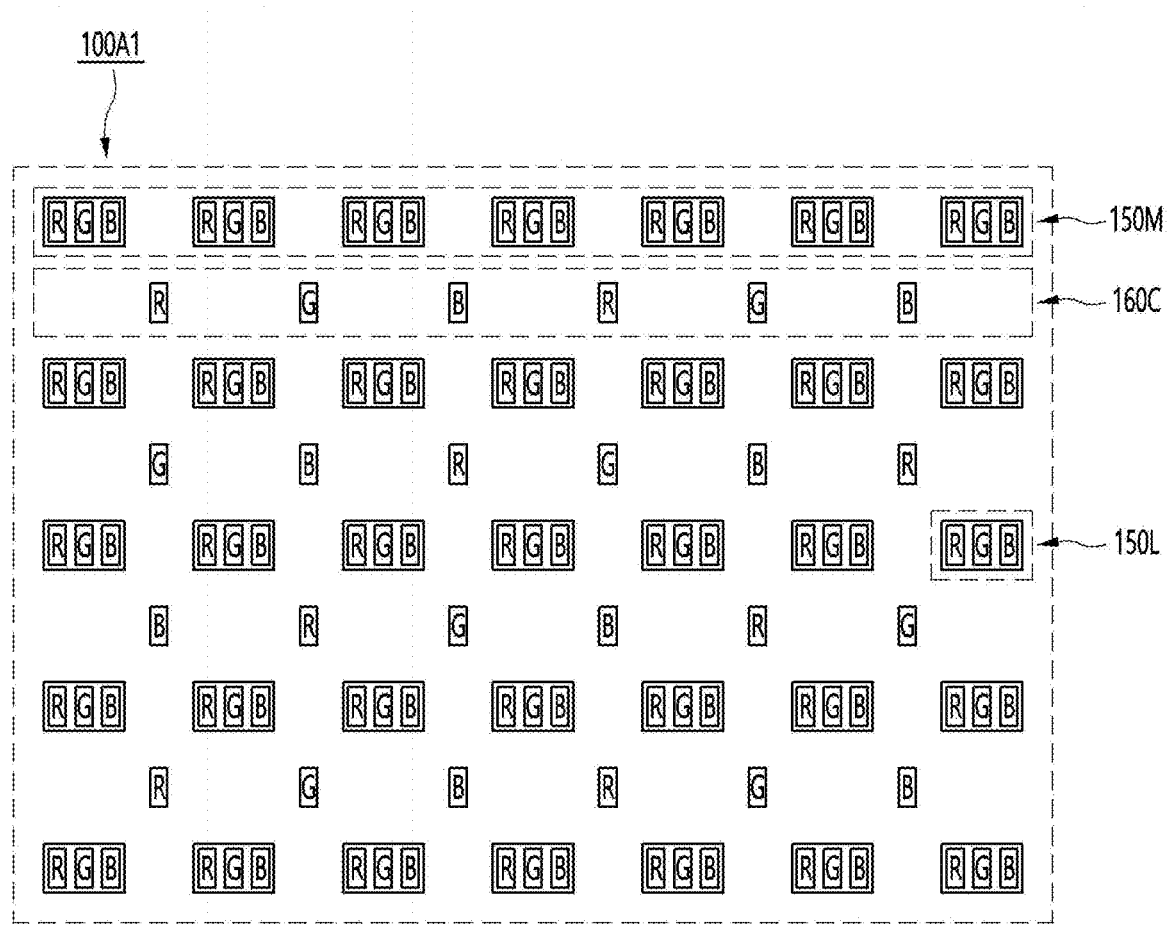
【FIG. 3A】
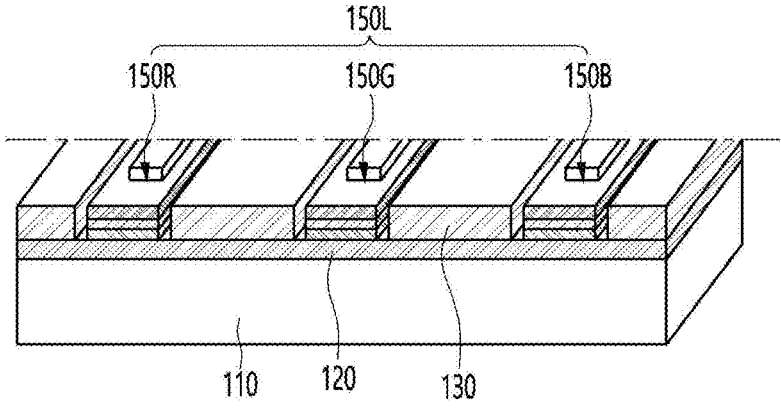

【FIG. 3B】
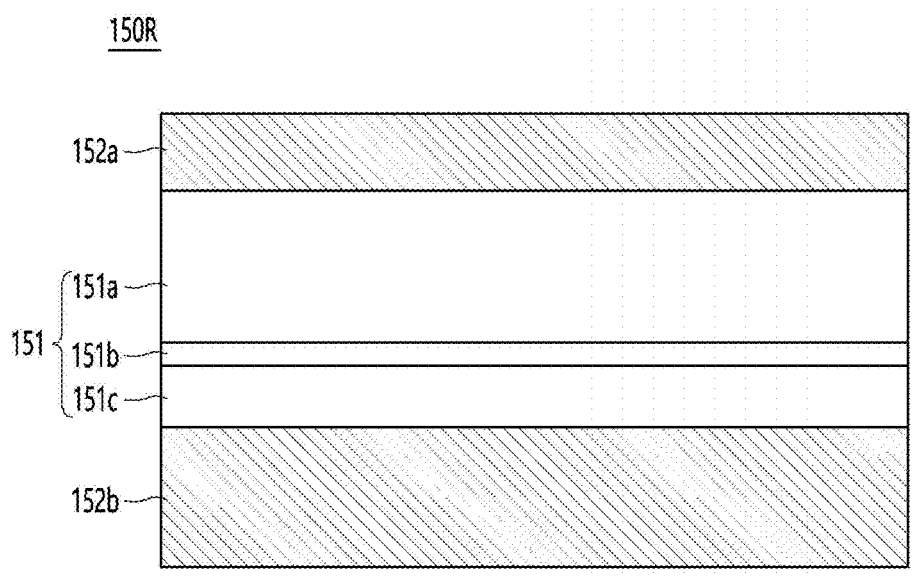
【FIG. 4】
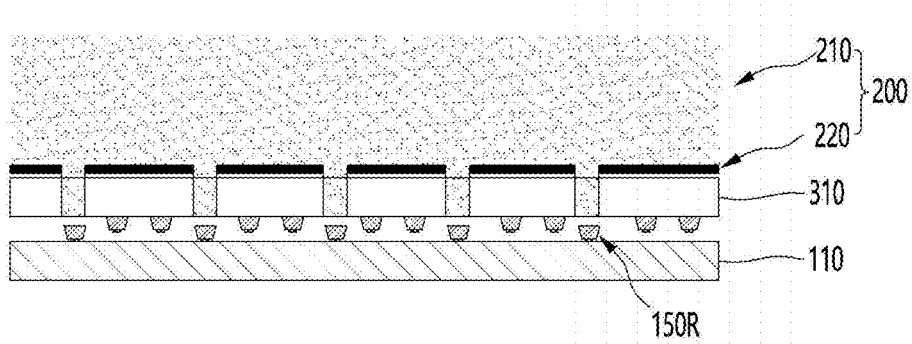

【FIG. 5】
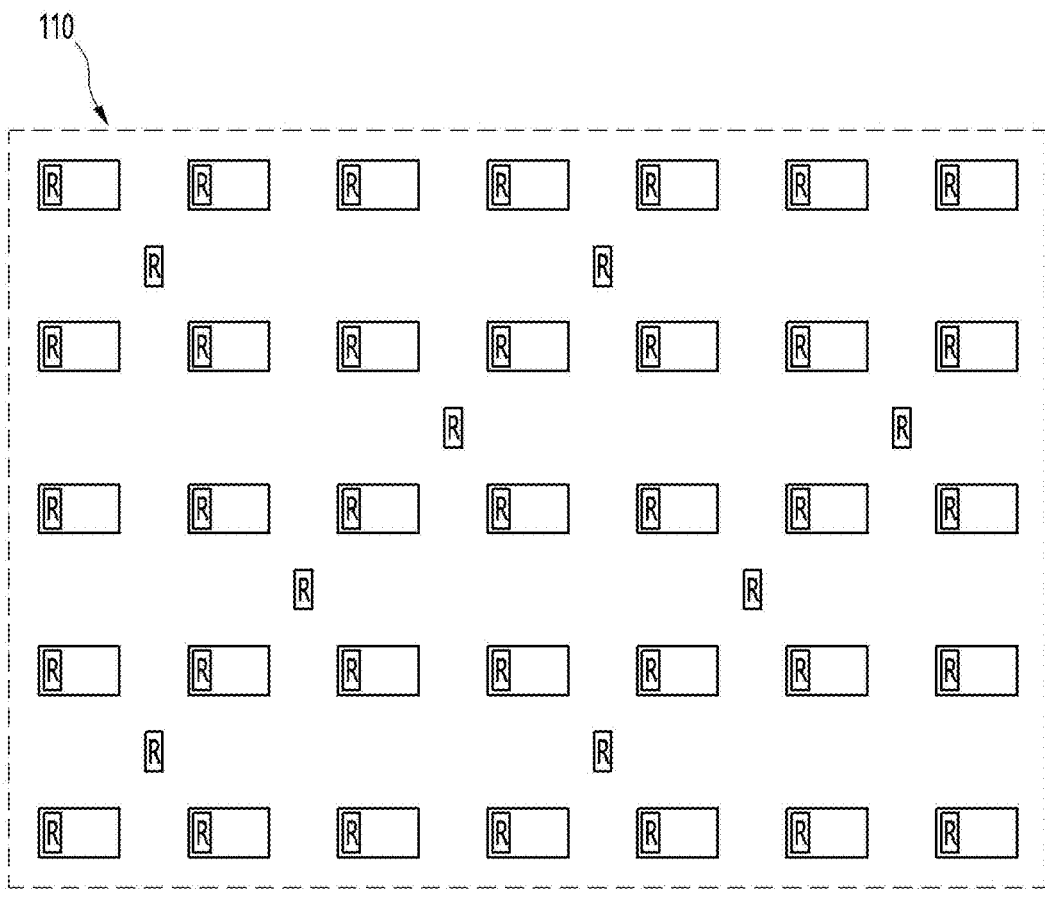

【FIG. 6A】
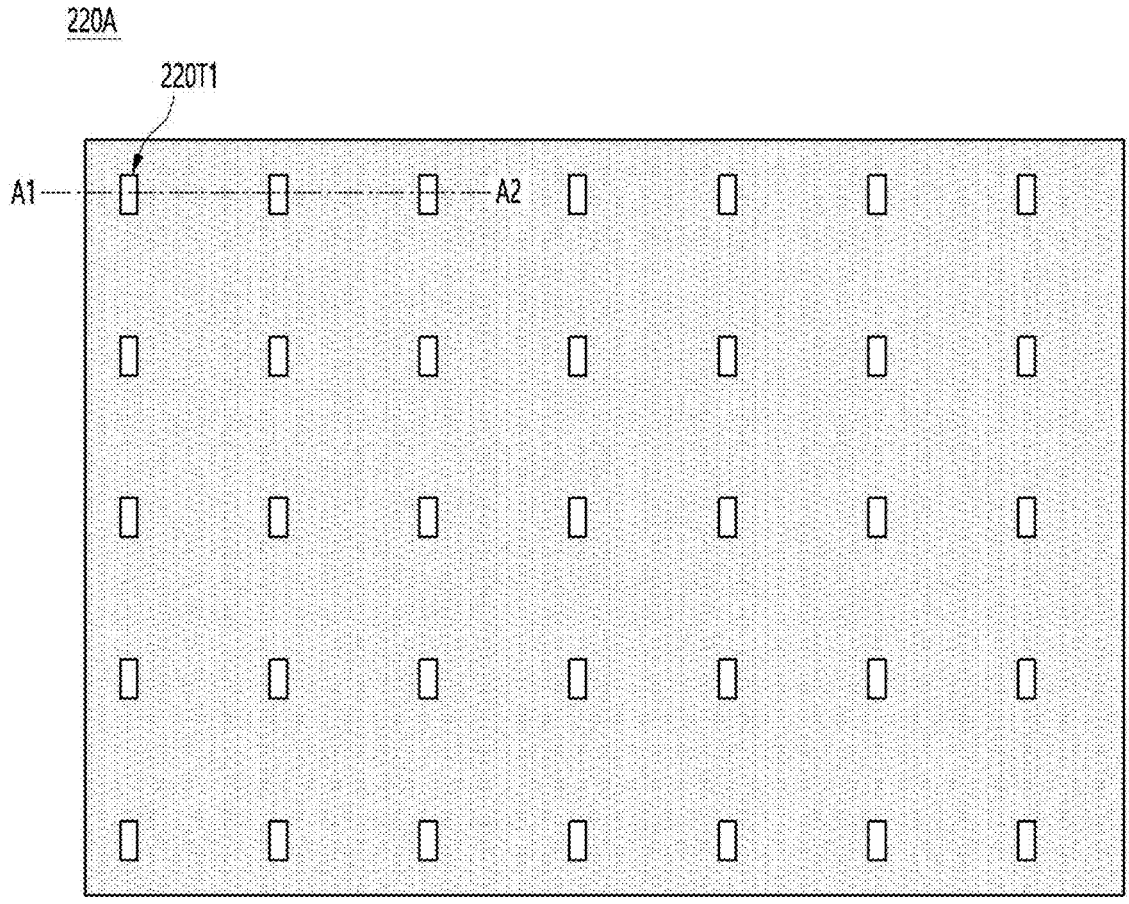

【FIG. 6B】
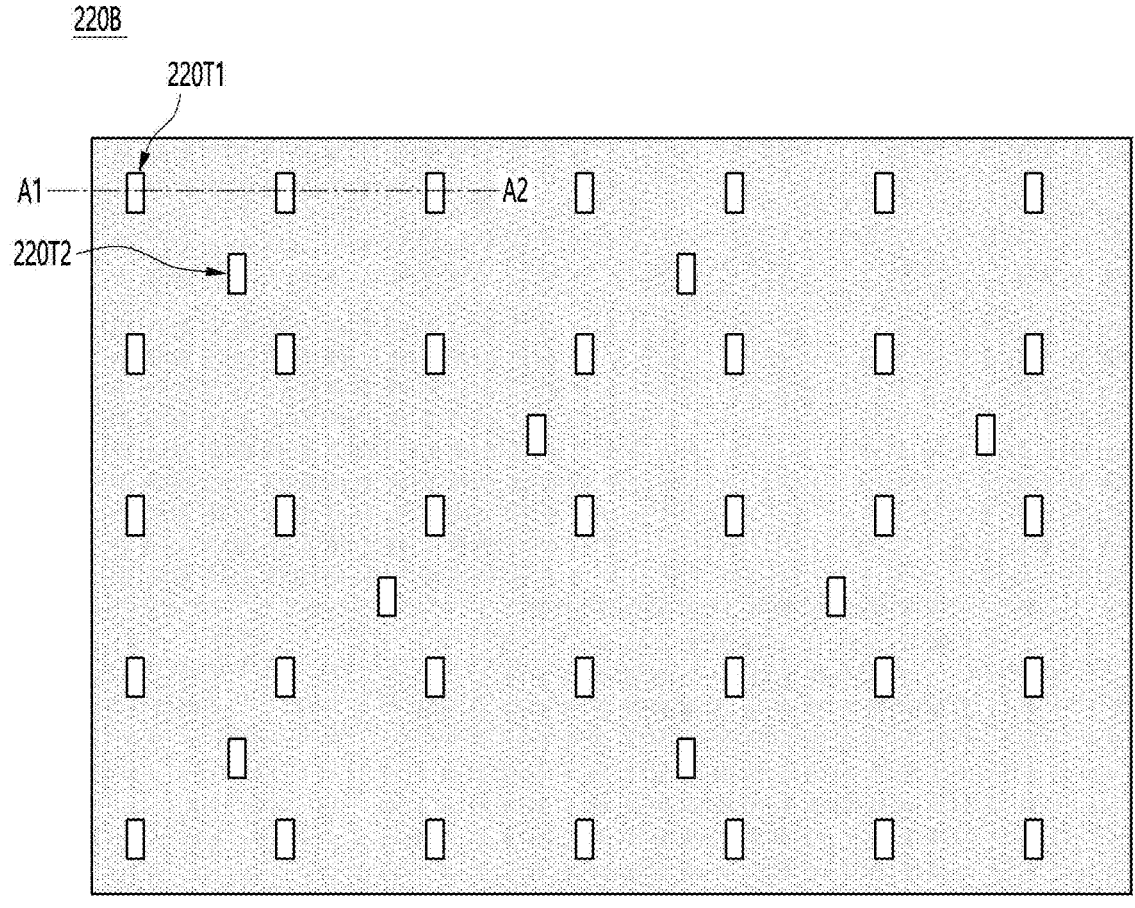
【FIG. 7】
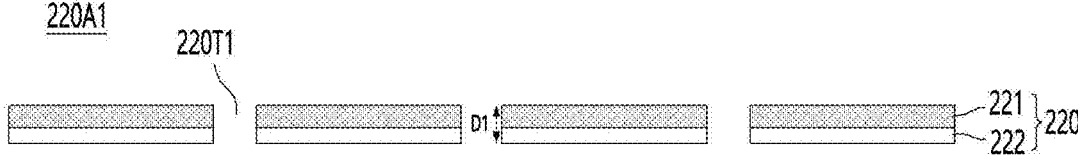

【FIG. 8】
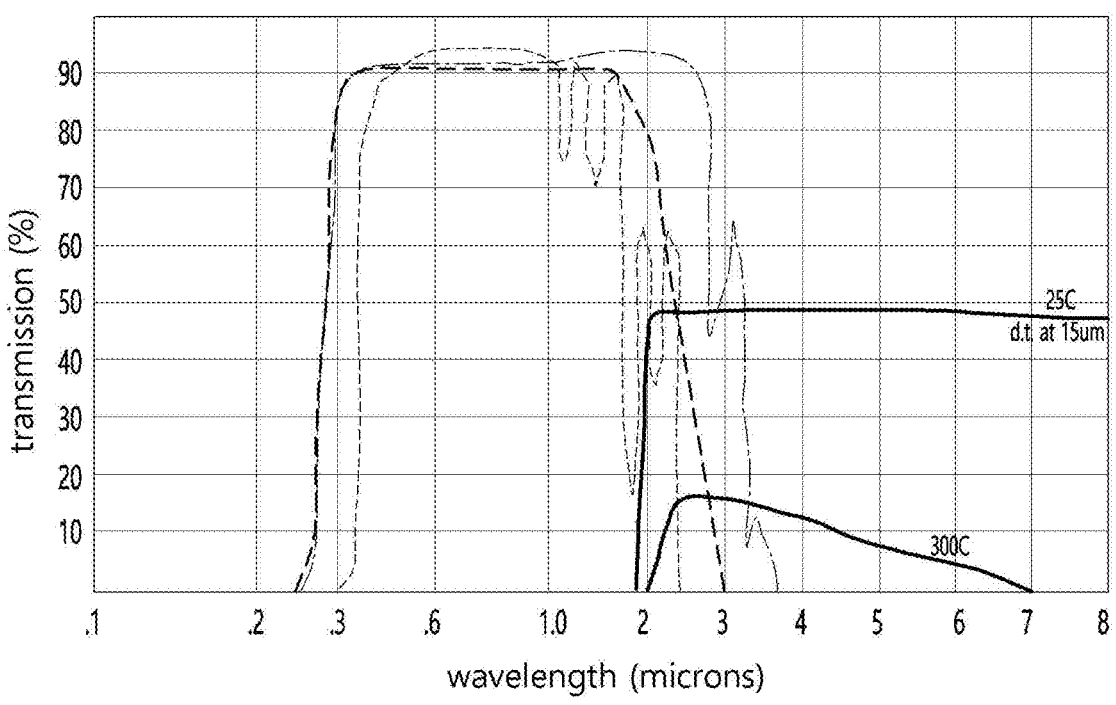
- – – – – –  Soda lime (BK7), 1mm
- ————  germanium, 3mm at 25C and 300C
- – · – · – ·  borosilicate, 1mm
- – – – – – –  acrylic, 1mm
【FIG. 9A】
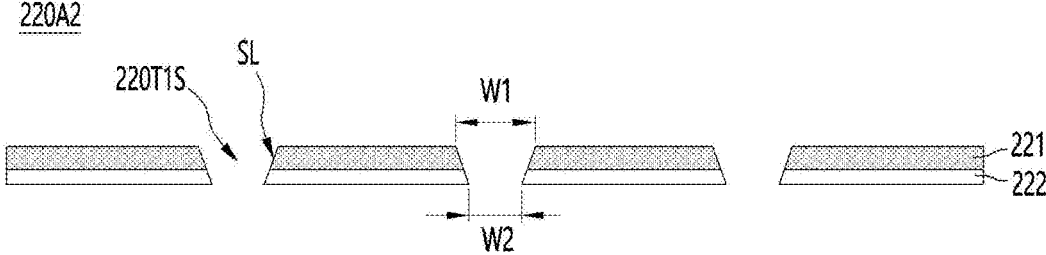

【FIG. 9B】
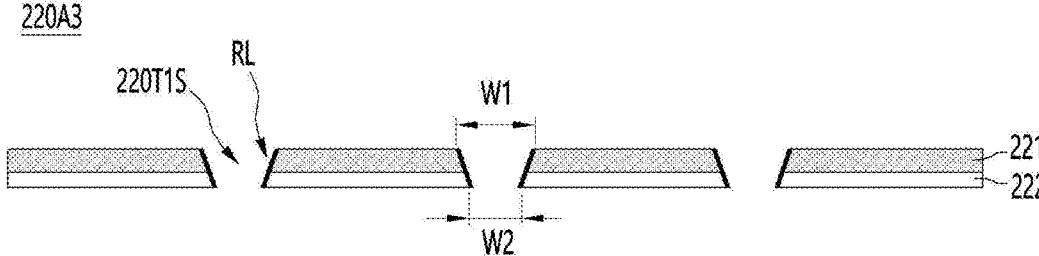
【FIG. 10A】
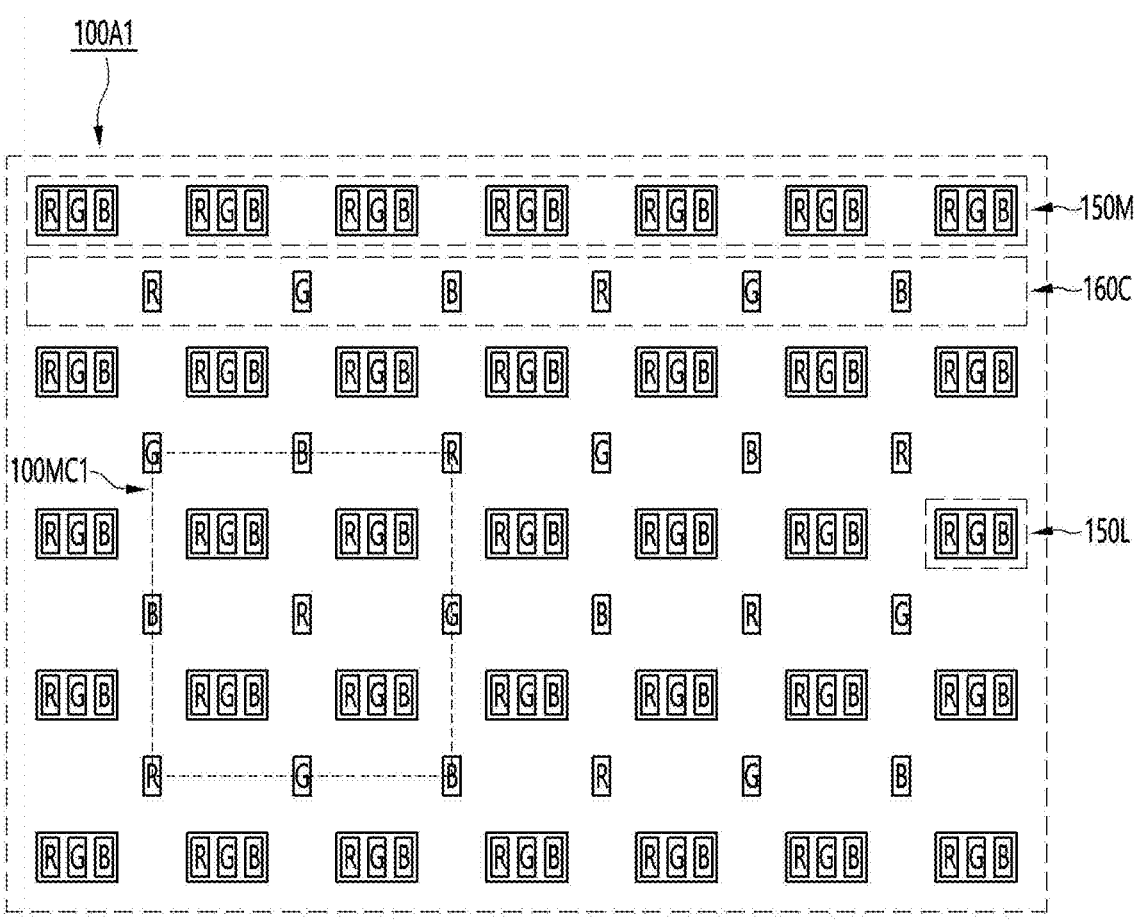

【FIG. 10B】
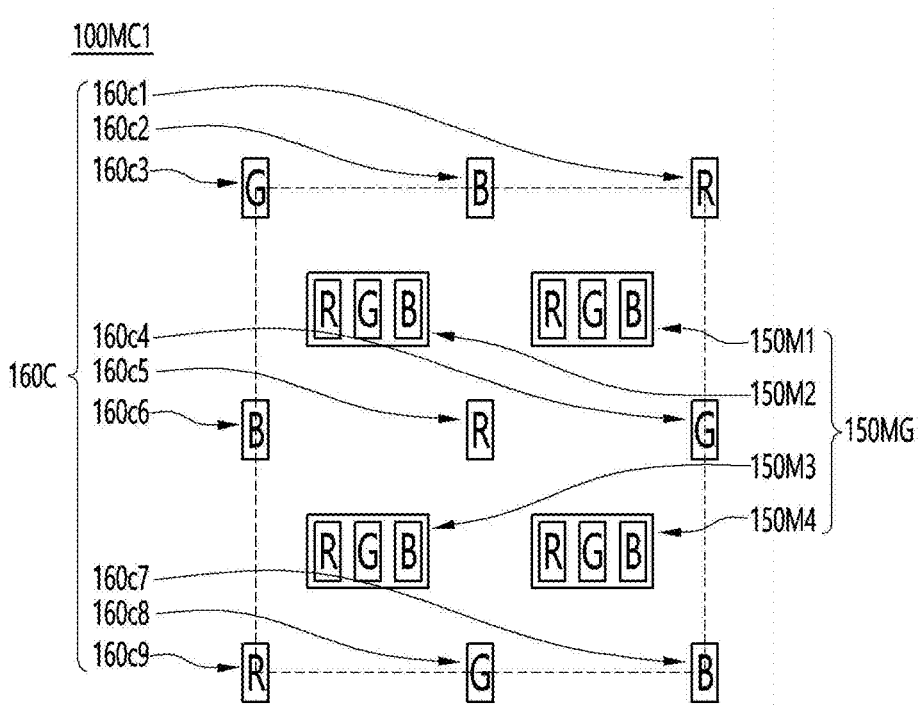

【FIG. 11A】
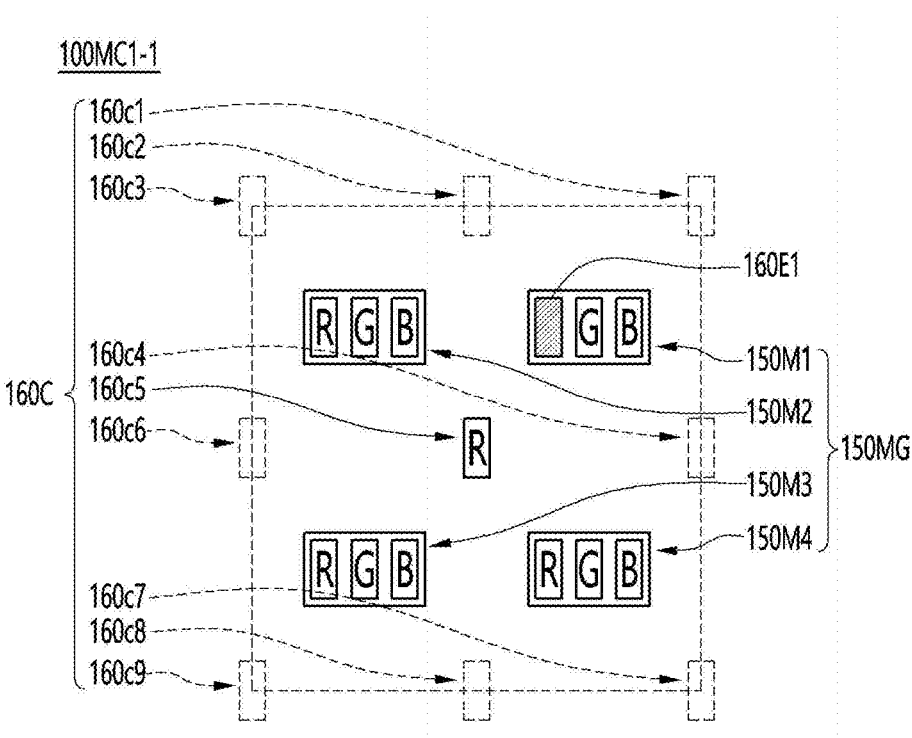

【FIG. 11B】
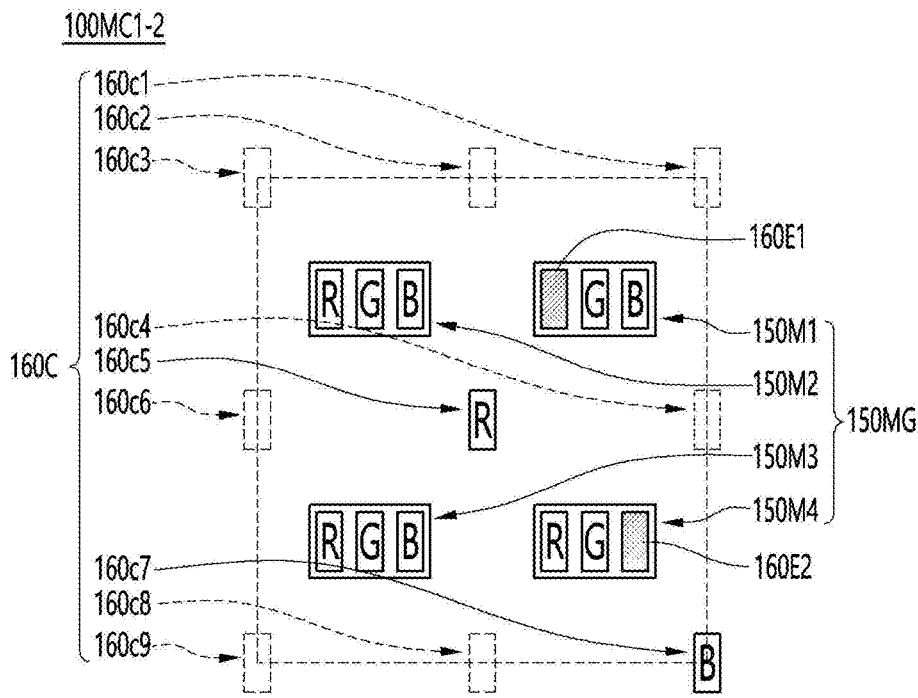

【FIG. 11C】
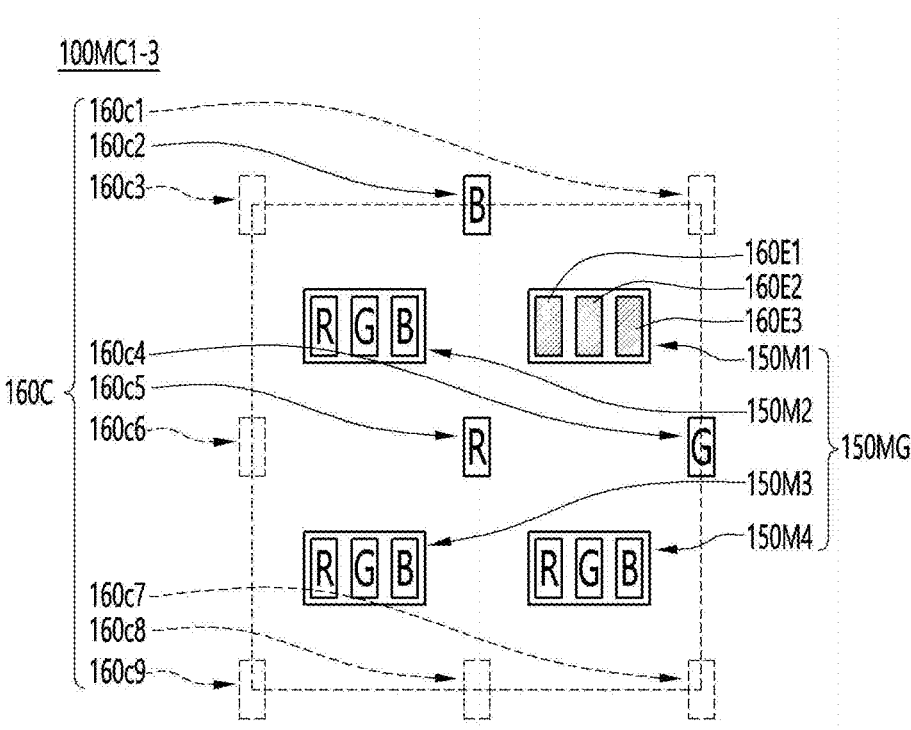

【FIG. 11D】
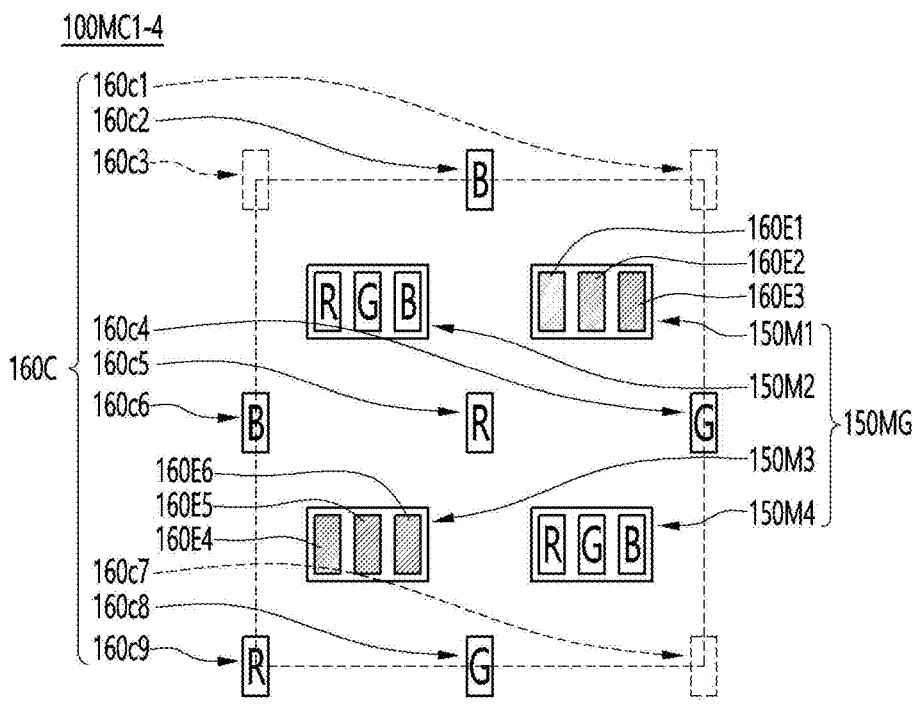

TRANSFER DEVICE FOR
SEMICONDUCTOR LIGHT EMITTING
DEVICE AND DISPLAY DEVICE OF
SEMICONDUCTOR LIGHT EMITTING
DEVICE USING SAME

CROSS REFERENCE TO RELATED
APPLICATIONS

This application is the National Phase of PCT International Application No. PCT/KR2020/011472, filed on Aug. 27, 2020, which is hereby expressly incorporated by reference into the present application.

TECHNICAL FIELD

Embodiment relates to a transfer device of a semiconductor light emitting device and a display device of a semiconductor light emitting device using the same.

BACKGROUND ART

Technologies for implementing large-area displays include liquid crystal displays (LCD), OLED displays, and Micro-LED displays.

Among them, the micro-LED display is a display using a micro-LED, which is a semiconductor light emitting device having a diameter or cross-sectional area of 100 μm or less, as a display device.

Since the micro-LED display uses micro-LED, which is a semiconductor light emitting device, as a display device, micro-LED displays have excellent performance in many characteristics, such as contrast ratio, response speed, color reproduction rate, viewing angle, brightness, resolution, lifespan, luminous efficiency or luminance.

In particular, the micro-LED display has the advantage of being free to adjust the size or resolution as the screen can be separated and combined in a modular manner, and the advantage of being able to implement a flexible display.

However, there is a technical problem in that it is difficult to quickly and accurately transfer the semiconductor light emitting device to the display panel because a large micro-LED display requires more than millions of semiconductor light emitting devices.

Recently developed transfer technology includes a pick and place process, a laser lift-off method (LLO), or a self-assembly method.

On the other hand, in the related art, LLO is a technology used for selective transfer of semiconductor light emitting device chips. Laser equipment used for transferring individual chips is composed of a complex optical system, and there are technical difficulties in precisely aligning between a laser shot and a light emitting device chip, and the equipment price is expensive.

For example, the related art LLO process proceeds according to the principle that a GaN layer, which is a substrate material, absorbs laser and vaporizes nitrogen (N) therein, thereby separating the LED chip from the substrate. At this time, in the related art LLO process, LLO is performed after adjusting the size of a laser shot to the level of the size of an individual light emitting device chip, and there is technical difficulty in precisely aligning between a laser shot and a light emitting device chip as a complex optical system is used.

On the other hand, among the prior arts, there is a Korean Patent Publication (Publication Number: KR2020-

0049946A, Publication Date: 2020 May 11) (hereinafter referred to as 'Prior art 1') as a micro LED transfer technology using a laser.

The Prior art 1 is a technology capable of increasing the mask replacement cycle by minimizing damage to the non-transmissive layer 130 by reducing the laser beam intensity in the buffer layer 120 before the laser beam reaches the non-transmissive layer 130. (refer to summary and paragraph [0031] of Prior art 1).

However, the buffer layer 120 employed in the Prior art 1 can prevent damage to the non-transmissive layer 130, but as the laser beam is dispersed in the buffer layer 120 (refer to paragraph [0046]), some lasers are dispersed and scattered, which can negatively affect precise alignment.

Also, in Prior art 1, since the laser beam needs to pass through the mask substrate 110, refraction of the laser beam can occur at the interface between the mask substrate 110 and the air, so there is still a problem in precise alignment of the laser beam and the light emitting device chip.

In recent micro LED technology, as the size of individual micro LED chips has become ultra-fine and the distance between individual micro LEDs has also become ultra-fine, precise alignment of the laser beam and the light emitting device chip is an important technical problem.

In particular, in the related art, there is a lack of awareness of the decrease in alignment accuracy due to the dispersion of the laser beam of the hard mask itself used for the LLO process, and there is also a lack of consideration for technical solutions.

On the other hand, in order to improve the low transfer rate and lighting rate of the micro-LED display, in the related art, a method of simultaneously arranging a main pixel and an auxiliary pixel or utilizing a repair chip to secure a yield have been proposed.

However, since the same number of auxiliary chips as the main pixels should be placed in the method of utilizing auxiliary pixels, twice as many chips as actually needed are transferred. Accordingly, the conventional method of using auxiliary pixels increases the difficulty of panel design and transfer process, and also increases chip material cost.

DISCLOSURE

Technical Problem

One of the technical problems of the embodiment is to provide a transfer device for a semiconductor light emitting device capable of precisely aligning between a laser beam and a semiconductor light emitting device in a transfer process of a semiconductor light emitting device and a display device for a semiconductor light emitting device using the same.

Also, one of the technical problems of the embodiment is to provide a semiconductor light emitting device transfer device capable of solving a decrease in alignment accuracy due to dispersion of a laser beam of a hard mask itself used in an LLO process and a semiconductor light emitting device display device using the same.

Also, one of the technical problems of the embodiment is to provide a display device of a semiconductor light emitting device capable of improving yield and reducing the difficulty of panel design and transfer process while employing auxiliary pixels.

The technical problems of the embodiment are not limited to those described in this section, and include those that can be grasped through the description of the invention.

Technical Solution

The semiconductor light emitting device transfer device according to the embodiment can include a line beam laser generator and a through-type glass mask disposed on a semiconductor substrate including a predetermined semiconductor light emitting device.

The line beam laser 210 generated by the line beam laser generator can pass through the through-type glass mask to selectively transfer the semiconductor light emitting device on the semiconductor substrate onto a predetermined panel substrate.

The through-type glass mask can include a plurality of spaced apart first through-type glass patterns in an area corresponding to the semiconductor light emitting device.

The through-type glass mask can include a light-blocking glass layer and a light reflecting metal layer disposed under the light-blocking glass layer, and the first through-type glass pattern can be formed by penetrating the light-blocking glass layer and the light-reflective metal layer in an area corresponding to the semiconductor light emitting device.

The size of the through-type glass mask can be greater than the size of the first panel area to which the semiconductor light emitting device is transferred.

The through-type glass mask can include an inclined through-type glass pattern.

In the inclined through-type glass pattern, a first width in which the light-blocking glass layer is etched can be greater than a second width in which the light-reflective metal layer is etched.

The through-type glass mask can include a reflective layer disposed on an inclined surface of the inclined through-type glass pattern.

The reflective layer can be formed on the first inclined surface where the light-blocking glass layer is etched.

The reflective layer can also be formed on the first inclined surface where the light-blocking glass layer is etched and the second inclined surface where the light-reflective metal layer is etched.

Also, the display device of the light emitting device according to the embodiment can include a main pixel group 150MG including a plurality of main pixels and a shared redundancy pixel 160C including a plurality of shared light emitting devices disposed between and around the plurality of main pixels.

The main pixel group 150MG can include a plurality of main pixels including a first semiconductor light emitting device R, a second semiconductor light emitting device G, and a third semiconductor light emitting device B.

The shared redundancy pixel 160C can include a first group sharing light emitting device disposed between the plurality of main pixels and a second group sharing light emitting device disposed around the plurality of main pixels.

The main pixel group 150MG can include a first main pixel 150M1, a second main pixel 150M2, a third main pixel 150M3, and a fourth main pixel 150M4 disposed adjacent to each other.

The first group shared light emitting device disposed between the plurality of main pixels can include a fifth shared light emitting device 160c5.

The second group shared light emitting devices disposed around the plurality of main pixels can include first to fourth and sixth to ninth shared light emitting devices (160c1, 160c2, 160c3, 160c4, 160c6, 160c7, 160c8, 160c9).

The first semiconductor light emitting device R, the second semiconductor light emitting device G, and the third semiconductor light emitting device B may be a red light emitting device R, a green light emitting device G, and a blue light emitting device B, respectively.

The first shared light emitting device 160c1, the fifth shared light emitting device 160c5, and the ninth shared light emitting device 160c9 may be Red R shared light emitting devices.

The third shared light emitting device 160c3, the fourth shared light emitting device 160c4, and the eighth shared light emitting device 160c8 may be Green G shared light emitting devices.

The second shared light emitting device 160c2, the sixth shared light emitting device 160c6, and the seventh shared light emitting device 160c7 may be blue B shared light emitting devices.

The first main pixel 150M1 can include a first error light emitting device 160E1 in which a light emitting device emitting red is defective.

Among the shared auxiliary pixels, the fifth shared light emitting device 160c5 emitting red light among shared light emitting devices adjacent to the first error light emitting device 160E1 can emit light as an auxiliary pixel.

The fourth main pixel 150M4 can include a second error light emitting device 160E2 in which a light emitting device emitting blue is defective, and among the shared auxiliary pixels, the seventh shared light emitting device 160c7 emitting blue among the shared light emitting devices adjacent to the second error light emitting device 160E2 can emit light as an auxiliary pixel.

In the first main pixel 150M1, a first error light emitting device 160E1, a second error light emitting device 160E2 and a third error light emitting device 160E3 can be included in areas corresponding to areas emitting red, blue, and green, respectively.

Among the shared auxiliary pixels, the fifth shared light emitting device 160c5 adjacent to the first error light emitting device 160E1 and emitting red light emits light as an auxiliary pixel. The fourth shared light emitting device 160c4, which is adjacent to the second error light emitting device 160E2 and emits green light, emits light as an auxiliary pixel. The second shared light emitting device 160c2 emitting blue and adjacent to the third error light emitting device 160E3 can emit light as an auxiliary pixel.

The third main pixel 150M3 can include a fourth error light emitting device 160E4, a fifth error light emitting device 160E5, and a sixth error light emitting device 160E6 in areas corresponding to areas emitting red, blue, and green, respectively. Among the shared auxiliary pixels, the 9 shared light emitting devices 160c9 emitting red and adjacent to the fourth error light emitting device 160E4 can emit light as auxiliary pixels. The eighth shared light emitting device 160c8 emitting green and adjacent to the fifth error light emitting device 160E5 can emit light as an auxiliary pixel. The sixth shared light emitting device 160c6 adjacent to the sixth error light emitting device 160E6 and emitting blue can emit light as an auxiliary pixel.

The first semiconductor light emitting device R, the second semiconductor light emitting device G and the third semiconductor light emitting device B can be a red light emitting device R, a green light emitting device G, and a blue light emitting device B, respectively. The second shared light emitting device 160c2, the fifth shared light emitting device 160c5, and the eighth shared light emitting device 160c8 can be red shared light emitting devices. The first shared light emitting device 160c1, the sixth shared light emitting device 160c6, and the seventh shared light emitting device 160c7 can be green shared light emitting devices. The third shared light emitting device 160c3, the fourth shared light emitting device 160c4, and the ninth shared light emitting device 160c9 can be blue shared light emitting devices.

First semiconductor light emitting devices R, which are red light emitting devices, can be arranged most adjacent to the fifth shared light emitting device 160c5, which is a red light emitting device, in the first to fourth main pixels 150M1, 150M2, 150M3, 150M4.

Effects of the Invention

According to the transfer device of the semiconductor light emitting device according to the embodiment and the display device of the semiconductor light emitting device using the same, there is a technical effect capable of precisely aligning the laser beam and the semiconductor light emitting device in the transfer process of the semiconductor light emitting device.

For example, according to the embodiment, LLO can be performed simultaneously by accurately aligning a plurality of semiconductor light emitting chips by an area corresponding to the laser size using a large-area line beam without using a complicated optical system, so there is a technical effect that can improve the yield along with improving the quality of the display.

Further, in the embodiment, as the depth D1 of the first through-type glass pattern 220T1 is the sum of the thicknesses of the light-blocking glass layer 221 and the light-reflective metal layer 222, the laser beam has a high focusing speed due to the depth D1 of the first through-type glass pattern 220T1. So, there is no refraction or dispersion of the laser beam, and there is a special technical effect of no power drop of the laser beam.

Also, according to the embodiment, there is a technical effect that enables ultra-precision alignment of the laser beam and the semiconductor light emitting device in the transfer process of the semiconductor light emitting device by solving the decrease in alignment accuracy due to the dispersion of the laser beam of the hard mask itself used in the LLO process.

Also, the through-type glass mask 220A2 according to the second embodiment includes the inclined through-type glass pattern 220T1S, so the focusing of the laser beam can be improved by the inclined surface SL of the inclined through-type glass pattern 220T1S, and the efficiency and alignment precision of the LLO process can be further improved.

Also, in the through-type glass mask 220A3 according to the third embodiment, as the reflective layer RL is formed on the inclined surface SL of the inclined through-type glass pattern 220T1S, the focusing of the laser beam can be improved, and the efficiency and alignment precision of the LLO process can be further improved.

In the through-type glass mask 220A3 according to the third embodiment, as the reflective layer RL is formed on the inclined surface SL of the inclined through-type glass pattern 220T1S, dispersion and absorption of the laser beam on the first inclined surface of the exposed light-blocking glass layer 221 are prevented, and the focusing power of the laser beam is improved. Due to this, there is a technical effect that can significantly improve the efficiency and alignment precision of the LLO process.

Also, according to the display device of the semiconductor light emitting device according to the embodiment, there is a technical effect that can reduce the difficulty of panel design and transfer process while improving the yield by arranging the 'shared semiconductor light emitting device' around the main pixel.

For example, when the first main pixel 150M1 includes the first error light emitting device 160E1 in the panel area after transfer, and the first error light emitting device 160E1 emits red light, among shared light emitting devices adjacent to the first error light emitting device 160E1, a fifth shared light emitting device 160c5 capable of emitting red light can function as an auxiliary pixel so that the first main pixel 160c5 operates as a normal unit pixel.

Also, according to the embodiment, a shared semiconductor light emitting device is disposed around the main pixel so that even when one main pixel itself is defective, the corresponding main pixel operates as a normal unit pixel through the shared auxiliary pixel, there is a special technical effect that can significantly reduce the difficulty of panel design and transfer process while significantly improving yield.

For example, in the embodiment, the fourth operating example 100MC1-4 is an example in which all of the first main pixels 150M1 are defective and all of the third main pixels 150M3 are defective. In the fourth operating example 100MC1-4 of the embodiment, since the fifth shared light emitting device 160c5 adjacent to the first error light emitting device 160E1 functions as an auxiliary pixel, the fourth shared light emitting device 160c4 adjacent to the second error light emitting device 160E2 functions as an auxiliary pixel, and the second shared light emitting device 160c2 adjacent to the third error light emitting device 160E3 functions as an auxiliary pixel, the first main pixel 150M1 can function as a normal unit pixel.

Also, according to the embodiment, a shared semiconductor light emitting device is disposed around the main pixel so that the main pixel operates as a normal unit pixel through the shared auxiliary pixel even when the two main pixels themselves are defective, there is a special technical effect that can significantly reduce the difficulty of panel design and transfer process while significantly improving yield.

Also, according to the second shared redundancy structure 100MC2 in the embodiment, by optimizing the arrangement of the shared light emitting devices or the arrangement of the semiconductor light emitting devices of the main pixel in consideration of the color of the shared light emitting device and the light emitting color of the semiconductor light emitting device, which is each sub-pixel constituting the main pixel, and increasing the probability that the shared light emitting device can function as an auxiliary pixel when an error occurs in the semiconductor light emitting device of the main pixel, there is a technical effect of reducing difficulty in panel design and transfer process while improving yield.

The technical effects of the embodiments are not limited to those described in this section, but include those that can be grasped through the description of the invention.

BRIEF DESCRIPTION OF THE DRAWING

FIG. 1 is an exemplary view in which a display device 100 according to an embodiment is disposed in a living room together with a washing machine 10, a robot cleaner 20, and an air purifier 30.

FIG. 2 is an enlarged view of the first panel area 100A1 in the display device 100 shown in FIG. 1.

FIG. 3A is a cross-sectional view of one unit pixel 150L in the first panel area 100A1 shown in FIG. 2

FIG. 3B is a cross-sectional view of the first semiconductor light emitting device 150R, which is one of the sub-pixels of the unit pixel in FIG. 3A.

FIG. 4 is an exemplary view of transfer progress using the semiconductor light emitting device transfer device 200 according to the embodiment.

FIG. 5 is a view showing a state in which the first semiconductor light emitting device R is transferred onto the panel substrate 110 in order to manufacture the first panel area 100A1 shown in FIG. 2.

FIG. 6A is a plan view of a first through-type glass mask 220A according to an exemplary embodiment for transferring the first semiconductor light emitting device R of the main pixel group 150MG onto the panel substrate 110 shown in FIG. 5.

FIG. 6B is a plan view of the second through-type glass mask 220B according to the embodiment for transferring the first semiconductor light emitting device R of the auxiliary pixel 160C shared with the main pixel group 150MG on the panel substrate 110 shown in FIG. 5.

FIG. 7 is as a cross-sectional view of the first through-type glass mask 220A or the second through-type glass mask 220B taken along line A1-A2 in FIGS. 6A and 6B. FIG. 7 is a cross-sectional view of the through-type glass mask 220A1 according to the first embodiment.

FIG. 8 shows transmittance data according to the wavelength (microns) of the material of the light-blocking glass layer 221 employed in the through-type glass mask 220 according to the embodiment.

FIG. 9A is a cross-sectional view of a through-type glass mask 220A2 according to a second embodiment.

FIG. 9B is a cross-sectional view of the through-type glass mask 220A3 according to the third embodiment.

FIG. 10A is a conceptual diagram illustrating a first shared redundancy structure 100MC1 including a main pixel and a shared auxiliary light emitting device in the display device shown in FIG. 2.

FIG. 10B is an enlarged view of the first shared redundancy structure 100MC1 of FIG. 10A.

FIGS. 11A to 11D are examples of the operation of the first shared redundancy structure 100MC1 in the embodiment.

MODE FOR INVENTION

Hereinafter, the embodiments disclosed in the present specification will be described in detail with reference to the accompanying drawings, but the same or similar components are given the same reference sign regardless of the reference numerals, and the redundant description thereof will be omitted. The suffixes "module" and "part" for components used in the following description are given or mixed in consideration of only the ease of writing the specification, and do not have a meaning or role distinct from each other by themselves. Also, the accompanying drawings are for easy understanding of the embodiments disclosed in the present specification, and the technical spirit disclosed in the present specification is not limited by the accompanying drawings. Also, when an element, such as a layer, area, or substrate, is referred to as being 'on' another component, this includes that it is directly on the other element or there can be other intermediate elements in between.

The display device described in this specification can include a mobile phone, a smart phone, a laptop computer, a digital broadcasting terminals, a personal digital assistants (PDA), a portable multimedia player (PMP), a navigation, a slate PC, a tablet PC, an ultra-book, a digital TV, a desktop computer, etc. However, the configuration according to the embodiment described in the present specification can be applied to a device capable of displaying even a new product form to be developed later.

Hereinafter, a display device including a semiconductor light emitting device according to an embodiment will be described.

FIG. 1 is an exemplary view in which the display device 100 according to the embodiment is disposed in the living room together with the washing machine 10, the robot cleaner 20, the air purifier 30, and the like.

The display device 100 of the embodiment can display the status of various electronic products such as the air cleaner 30, the robot cleaner 20, and the washing machine 10, can communicate wirelessly with each electronic product based on IOT and can control each electronic product based on user's setting data.

The display device 100 according to the embodiment can include a flexible display fabricated on a thin and flexible substrate. The flexible display can be bent or rolled like paper while maintaining characteristics of a conventional flat panel display.

In the flexible display, visual information can be implemented by independently controlling light emission of unit pixels arranged in a matrix form. The unit pixel means a minimum unit for realizing one color. The unit pixel of the flexible display can be implemented by a semiconductor light emitting device. In an embodiment, the semiconductor light emitting device can be a Micro-LED, but is not limited thereto.

Next, FIG. 2 is an enlarged view of the first panel area 100A1 in the display device 100 shown in FIG. 1. FIG. 3A is a cross-sectional view of one unit pixel 150L in the first panel area 100A1 shown in FIG. 2. FIG. 3B is a cross-sectional view of the first semiconductor light emitting device 150R, which is one of sub-pixels of the unit pixel in FIG. 3A.

Referring to FIG. 2, the display device 100 of the embodiment can include a plurality of panel areas including the first panel area 100A1. In the display device, each panel area can be mechanically coupled by tiling and electrically connected to form the display device 100.

In the embodiment, each semiconductor light emitting device can be driven in an active matrix (AM) method or a passive matrix (PM) method.

One of the technical problems of the embodiment is to provide a display device of a semiconductor light emitting device capable of improving yield and reducing the difficulty of panel design and transfer process while employing auxiliary pixels.

To solve this technical problem, as shown in FIG. 2, the area of the first panel area 100A1 of the embodiment can include a main pixel area 150M and a shared redundancy pixel 160C.

The main pixel area 150M can include a plurality of unit pixels 150L, and each unit pixel 150L can include a first semiconductor light emitting device R, a second semiconductor light emitting device G, and a third semiconductor light emitting device B as sub-pixels. The first semiconductor light emitting device R, the second semiconductor light emitting device G, and the third semiconductor light emitting device B can be a red light emitting device R, a green light emitting device G, and a blue light emitting device B, respectively, but is not limited thereto.

The shared auxiliary pixel 160C can include a plurality of shared light emitting devices. Referring briefly to FIG. 10*b*, the shared redundancy pixel 160C can include a first group shared light emitting device disposed between the plurality of main pixels and a second group shared light emitting device disposed around the plurality of main pixels.

The main pixel area 150M can include a main pixel group 150MG including a first main pixel 150M1, a second main pixel 150M2, a third main pixel 150M3 and a fourth main pixel 150M4 disposed adjacent to each other.

The shared auxiliary pixel 160C can include a first shared light emitting device 160c1, a second shared light emitting device 160c2, a third shared light emitting device 160c3, a fourth shared light emitting device 160c4, a fifth shared light emitting device 160c5, a sixth shared light emitting device 160c6, a seventh shared light emitting device 160c7, an eighth shared light emitting device 160c8, and a ninth shared light emitting device 160c9.

The first group shared light emitting device disposed between the plurality of main pixels can be a fifth shared light emitting device 160c5, and the second group shared light emitting device disposed around the plurality of main pixels can include first to fourth and sixth to ninth shared light emitting devices (160c1, 160c2, 160c3, 160c4, 160c6, 160c7, 160c8, 160c9), but is not limited thereto.

The first shared light emitting device 160c1, the fifth shared light emitting device 160c5, and the ninth shared light emitting device 160c9 can be a Red R shared light emitting device, the third shared light emitting device 160c3, the fourth shared light emitting device 160c4, and the eighth shared light emitting device 160c8 can be a Green G shared light emitting device, the second shared light emitting device 160c2, the sixth shared light emitting device 160c6, and the seventh shared light emitting device 160c7 can be a blue B shared light emitting device, but is not limited thereto.

Referring to FIGS. 3A and 3B again, FIG. 3A is a cross-sectional view of one unit pixel 150L in the first panel area 100A1 shown in FIG. 2. FIG. 3B is a cross-sectional view of the first semiconductor light emitting device 150R which is one of the sub-pixels of the unit pixel in FIG. 3A.

Referring to FIG. 3A, the display device 100 according to the embodiment can include a panel substrate 110, a first panel electrode 120, a second panel electrode (not shown), an insulating layer 130, and a plurality of semiconductor light emitting devices. For example, the unit pixel 150L of the embodiment can include a plurality of sub-pixels including a red light emitting device 150R, a green light emitting device 150G, and a blue light emitting device 150B.

Each of the semiconductor light emitting device can be a semiconductor light emitting device that emits red, green and blue light to form a sub-pixel, but is not limited thereto, and each of the semiconductor light emitting devices can include a red phosphor and a green phosphor to implement red and green respectively.

The panel substrate 110 can be formed of glass or polyimide. Also, the panel substrate 110 can include a flexible material such as polyethylene naphthalate (PEN) or polyethylene terephthalate (PET). Also, the panel substrate 110 can be made of a transparent material, but is not limited thereto.

The insulating layer 130 can include an insulating and flexible material such as polyimide, PEN, PET, etc., and can be integrally formed with the panel substrate 110 to form a single substrate.

The insulating layer 130 can be a conductive adhesive layer having adhesiveness and conductivity, and the conductive adhesive layer can have flexibility to enable a flexible function of the display device. For example, the insulating layer 130 may be an anisotropy conductive film (ACF) or a conductive adhesive layer such as an anisotropic conductive medium or a solution containing conductive particles. The conductive adhesive layer may be a layer that is electrically conductive in a direction perpendicular to the thickness, but electrically insulating in a direction horizontal to the thickness.

Next, referring to FIG. 3B, the first semiconductor light emitting device 150R, which is one of the sub-pixels of the unit pixel, may be a vertical type semiconductor light emitting device. The semiconductor light emitting device that can be employed in the embodiment is not limited to the vertical type semiconductor light emitting device, and can include a lateral type semiconductor light emitting device or a flip type light emitting device.

The semiconductor light emitting device employed in the embodiment is a p-n junction diode in which electric energy is converted into light energy, and can be made of a compound semiconductor containing elements of Groups III and V on the periodic table, and can implement various colors such as red, green, and blue by controlling the band gap energy by adjusting the composition ratio of the compound semiconductor.

The first semiconductor light emitting device 150R can include a light emitting structure 151 including a first conductivity type semiconductor layer 151a, an active layer 151b, and a second conductivity type semiconductor layer 151c, a first electrode layer 152a and a second electrode layer 152c electrically connected to the first conductivity type semiconductor layer 151a and the second conductivity type semiconductor layer 151c of the light emitting structure 151, respectively.

FIG. 4 is an exemplary view of transfer progress using the semiconductor light emitting device transfer device 200 according to the embodiment.

The semiconductor light emitting device transfer device 200 according to the embodiment can selectively transfer the semiconductor light emitting device on the semiconductor substrate 310 onto a predetermined panel substrate 110 using the line beam laser 210 and the through-type glass mask 220. For example, the transferred semiconductor light emitting device can be a red light emitting device as the first semiconductor light emitting device 150R, but is not limited thereto.

According to the transfer device of the semiconductor light emitting device according to the embodiment, there is a technical effect of precisely aligning the laser beam and the semiconductor light emitting device in the transfer process of the semiconductor light emitting device.

Also, according to the embodiment, as it is possible to simultaneously perform LLO by accurately aligning a plurality of semiconductor light emitting chips as much as the area corresponding to the laser size using a large area line beam without using a complicated optical system, there is a technical effect that can improve the yield along with improving the quality of the display.

Next, FIG. 5 is a view showing a state in which the first semiconductor light emitting device R, which is a red light emitting device, is transferred onto the panel substrate 110 in order to manufacture the first panel area 100A1 shown in FIG. 2.

Next, FIG. 6A is a plan view of a first through-type glass mask 220A according to an embodiment for transferring a first semiconductor light emitting device R, which is a red light emitting device of the main pixel group 150MG, onto a panel substrate 110 as shown in FIG. 5.

The first through-type glass mask 220A can include a plurality of spaced apart first through-type glass patterns 220T1 in areas corresponding to the first semiconductor light emitting devices R of the main pixel group 150MG.

Next, FIG. 6B is a plan view of the second through-type glass mask 220B according to the embodiment for transferring the first semiconductor light emitting device R of the auxiliary pixel 160C shared with the main pixel group 150MG on the panel substrate 110 as shown in FIG. 5.

The second through-type glass mask 220B can include a first through-type glass pattern 220T1 in an area corresponding to the first semiconductor light emitting device R of the main pixel group 150MG and a second through-type glass pattern 220T2 in an area corresponding to the first semiconductor light emitting device R of the shared auxiliary pixel 160C.

FIG. 7 is a cross-sectional view of the first through-type glass mask 220A or the second through-type glass mask 220B taken along line A1-A2 in FIGS. 6A and 6B. FIG. 7 is a cross-sectional view of the through-type glass mask 220A1 according to the first embodiment.

The through-type glass mask 220A1 according to the first embodiment can include a light-blocking glass layer 221 and a light reflecting metal layer 222 and a first through-type glass pattern 220T1 penetrating the light-blocking glass layer 221 and the light reflecting metal layer 222.

The material of the light-blocking glass layer 221 can be any one of borosilicate glass, germanium glass, acrylic glass, UV grade fused silica glass, and semiconductor grade fused quartz, but is not limited thereto.

The light reflection metal layer 222 can include Al, Ag, Ni, Ti, or one or two or more alloy layers thereof, but is not limited thereto.

Also, the light-reflective metal layer 222 can include a metal reflective layer and a dielectric layer, but is not limited thereto.

FIG. 8 shows transmittance data according to the wavelength (microns) of the material of the light-blocking glass layer 221 used in the through-type glass mask 220 according to the embodiment.

One of the technical problems of the embodiment is to provide a transfer device for a semiconductor light emitting device capable of precisely aligning a laser beam and a semiconductor light emitting device in a transfer process of a semiconductor light emitting device and a display device for a semiconductor light emitting device using the same.

As described above, the buffer layer 120 used in the Prior art 1 may prevent damage to the non-transmissive layer 130, but as the laser beam is dispersed in the buffer layer 120, some lasers can be dispersed and scattered, which can negatively affect precise alignment.

On the other hand, in the laser wavelength (157 nm to 350 nm) employed in Prior art 1, the light transmittance of the glass substrate 210 such as sapphire is reduced to 65%, as in the Prior art 1, there is a limit to using a sapphire substrate as thin as possible with a thickness of 80 to 100 μm (see paragraph [0068]).

In particular, in Prior art 1, since the laser beam must pass through the mask substrate 110, refraction of light can occur at the interface between the mask substrate 110 and the air, so there is still a problem in precise alignment of the laser beam and the light emitting device chip.

Referring to FIG. 7, the through-type glass mask 220A1 according to the first embodiment can include a light-blocking glass layer 221 and a light reflecting metal layer 222, and a first through-type glass pattern 220T1 penetrating the light-blocking glass layer 221 and the light reflecting metal layer 222 can be included.

Through the light-blocking glass layer 221 made of glass that fundamentally absorbs and blocks the wavelength of the laser beam and the light-reflecting metal layer 222 that can block the laser beam, accordingly, the through-type glass mask 220A1 according to the first embodiment blocks a laser beam in an area other than the first through-type glass pattern 220T1, so alignment accuracy between the through-type glass mask 220A1 according to the first embodiment and the semiconductor light emitting device can be remarkably improved.

In particular, unlike the refraction of light happens at the interface between the mask substrate 110 and the air in Prior art 1, according to the embodiment, the laser beam passes through the first through-type glass pattern 220T1, the LLO process proceeds without refraction or dispersion of the laser beam, so the laser beam and the light emitting device chip can be precisely aligned.

Further, in the embodiment, as the depth D1 of the first through-type glass pattern 220T1 is the sum of the thicknesses of the light-blocking glass layer 221 and the light-reflective metal layer 222, the laser beam can realize a high focusing speed by the depth D1 of the first through-type glass pattern 220T1, so there is no deflection or dispersion of the laser beam, as well as a special technical effect of no power drop of the laser beam.

For example, referring to FIG. 8, when the material of the light-blocking glass layer 221 of the embodiment is borosilicate glass and the laser beam wavelength is 248 nm or 266 nm, the wavelength transmittance is less than 10%, and the light-blocking effect can be excellent, and laser light partially transmitted by the light reflection metal layer 222 can be blocked.

Through this, the light-blocking glass layer 221 made of glass that fundamentally can absorb and block the wavelength of the laser beam and the light-reflecting metal layer 222 can block the laser beam. Accordingly, the through-type glass mask 220A1 according to the first embodiment blocks a laser beam in an area other than the first through-type glass pattern 220T1, so alignment accuracy between the through-type glass mask 220A1 according to the first embodiment and the semiconductor light emitting device can be remarkably improved.

Also, according to the embodiment, the laser beam passes through the first through-type glass pattern 220T1, since light is not refracted at the interface between the light-blocking glass layer 221 and air, and the LLO process can proceed without refraction or dispersion of the laser beam, there is a technical effect that enables precise alignment of the laser beam and the light emitting device chip.

Also, in the embodiment, as the depth D1 of the first through-type glass pattern 220T1 is deep, there is a special technical effect of no power drop of the laser beam because the laser beam has a high focusing speed due to the depth D1 of the first through-type glass pattern 220T1.

Referring also to FIG. 6B, according to an embodiment, the through-type glass mask 220A can be used to transfer the first semiconductor light emitting device 150R in another panel area thereafter.

Also, according to the embodiment, the through-type glass mask 220A can also be used to transfer the second semiconductor light emitting device 150G or the third semiconductor light emitting device 150B to the first panel area 100A1 through position correction.

For example, according to the embodiment, when the size of the through-type glass mask 220A is larger than the size of the first panel area 100A1, the second semiconductor light emitting device 150G or the third semiconductor light emitting device 150B can be transferred to the first panel area 100A1 by correcting the position of the through-type glass mask 220A to the left or right.

Next, FIG. 9A is a cross-sectional view of the through-type glass mask 220A2 according to the second embodiment.

The through-type glass mask 220A2 according to the second embodiment can adopt technical characteristics of the through-type glass mask 220A1 according to the first embodiment. Hereinafter, the technical features of the second embodiment will be mainly described.

The through-type glass mask 220A2 according to the second embodiment can include an inclined through-type glass pattern 220T1S.

In the inclined through-type glass pattern 220T1S, a first width W1 in which the light-blocking glass layer 221 is etched can be greater than a second width W2 in which the light reflecting metal layer 222 is etched.

The inclined surface of the inclined through-type glass pattern 220T1S may be a low inclined surface.

The through-type glass mask 220A2 according to the second embodiment includes the inclined through-type glass pattern 220T1S, can improve the efficiency and alignment accuracy of the LLO process by improving the focusing of the laser beam by the inclined surface SL of the inclined through-type glass pattern 220T1S.

Next, FIG. 9B is a cross-sectional view of the through-type glass mask 220A3 according to the third embodiment.

The through-type glass mask 220A3 according to the third embodiment can adopt the technical characteristics of the through-type glass mask 220A1 according to the first embodiment and the through-type glass mask 220A2 according to the second embodiment. Hereinafter, the technical features of the third embodiment will be mainly described.

The through-type glass mask 220A3 according to the third embodiment can include an inclined through-type glass pattern 220T1S.

In the inclined through-type glass pattern 220T1S, the first width W1 in which the light-blocking glass layer 221 is etched can be greater than the second width W2 in which the light reflecting metal layer 222 is etched.

The inclined surface of the inclined through-type glass pattern 220T1S may be a low inclined surface.

The through-type glass mask 220A3 according to the third embodiment includes the inclined through-type glass pattern 220T1S, the efficiency and alignment precision of the LLO process can be improved by improving the focusing of the laser beam by the inclined surface SL of the inclined through-type glass pattern 220T1S.

In particular, the through-type glass mask 220A3 according to the third embodiment forms the reflective layer RL on the inclined surface SL of the inclined through-type glass pattern 220T1S, and can further improve the efficiency and alignment precision of the LLO process by improving the focusing of the laser beam.

The reflective layer RL can be formed on part or all of the inclined surface SL of the inclined through-type glass pattern 220T1S. The reflective layer RL can include, but is not limited to, Al, Ag, Ni, Ti, an alloy layer of one or two or more thereof, or a dielectric layer.

For example, the reflective layer RL can be formed on a first inclined surface where the light-blocking glass layer 221 is etched.

Also, the reflective layer RL can be formed on the first inclined surface where the light-blocking glass layer 221 is etched and the second inclined surface where the light-reflective metal layer 222 is etched.

As described above, in recent micro LED technology, as the size of individual micro LED chips is ultra-miniaturized, and especially the spacing between individual micro LEDs is ultra-miniaturized, precise alignment of a laser beam and a light emitting device chip is an important technical task.

In the related art, there is a lack of awareness of the decrease in alignment accuracy due to the dispersion of the laser beam of the hard mask itself used for the LLO process, and there is also a lack of consideration for technical solutions.

In the through-type glass mask 220A3 according to the third embodiment, the reflective layer RL is formed on the inclined surface SL of the inclined through-type glass pattern 220T1S, the through-type glass mask 220a3 prevents dispersion and absorption of the laser beam on the first inclined surface of the exposed light-blocking glass layer 221, and at the same time improves the focusing power of the laser beam. So there is a technical effect that can significantly improve the efficiency and alignment precision of the LLO process.

Next, FIG. 10A is a conceptual diagram illustrating a first shared redundancy structure 100MC1 including a main pixel and a shared auxiliary light emitting device in the display device shown in FIG. 2.

FIG. 10B is an enlarged view of the first shared redundancy structure 100MC1 of FIG. 10A.

Referring to FIG. 10B, in an embodiment, a first shared redundancy structure 100MC1 can include the main pixel group 150MG and the auxiliary pixel 160C shared with. The shared auxiliary pixel 160C can include a plurality of shared light emitting devices. The shared light emitting device can function as an auxiliary light emitting device.

In the first shared redundancy structure 100MC1, the main pixel group 150MG can include a first main pixel 150M1, a second main pixel 150M2, a third main pixel 150M3, and a fourth main pixel 150M4 disposed adjacent to each other.

Each of the first to fourth main pixels 150M1, 150M2, 150M3, and 150M4 can function as a unit pixel, and can include first semiconductor light emitting device R, a second semiconductor light emitting device G, and a third semiconductor light emitting device B, respectively. The first semiconductor light emitting device R can be a red light emitting device, the second semiconductor light emitting device G can be a green light emitting device, and the third semiconductor light emitting device B can be a blue light emitting device, but is not limited thereto.

The first to third light emitting devices R, G, and B can be at least one of a horizontal light emitting device, a vertical light emitting device, and a flip type light emitting device.

The shared auxiliary pixels 160C can include a first shared light emitting device 160c1, a second shared light emitting device 160c2, a third shared light emitting device 160c3, a fourth shared light emitting device 160c4, a fifth shared light emitting device 160c5, a sixth shared light emitting device 160c6, a seventh shared light emitting device 160c7, an eighth shared light emitting device 160c8, and a ninth shared light emitting device 160c9.

The first shared light emitting device 160c1, the fifth shared light emitting device 160c5, and the ninth shared light emitting device 160c9 can be red shared light emitting devices. The third shared light emitting device 160c3, the fourth shared light emitting device 160c4, and the eighth shared light emitting device 160c8 can be shared Green light emitting devices. The second shared light emitting device 160c2, the sixth shared light emitting device 160c6, and the seventh shared light emitting device 160c7 can be blue shared light emitting devices, but are not limited thereto.

According to the first shared redundancy structure 100MC1 of the embodiment, a 2×2 main pixel group 150MG can be surrounded by a shared auxiliary pixel 160C including 9 shared light emitting devices.

The shared auxiliary pixel 160C can have three chips for each RGB color, and can include a total of nine shared light emitting devices, but is not limited thereto.

Next, FIGS. 11A to 11D are operational examples of the first shared redundancy structure 100MC1 in the embodiment.

FIG. 11A is a first operating example 100MC1-1 of the first shared redundancy structure 100MC1 in the embodiment.

In the embodiment, the first operating example 100MC1-1 is an example in which the first semiconductor light emitting device R in the first main pixel 150M1 is defective. For example, when the first main pixel 150M1 includes the first error light emitting device 160E1 which emits red light.

In the first operating example 100MC1-1 of the embodiment, among shared auxiliary pixels, a fifth shared light emitting device 160c5 capable of emitting red light among shared light emitting devices adjacent to the first error light emitting device 160E1 can function as an auxiliary pixel.

For example, when the first main pixel 150M1 includes the first error light emitting device 160E1 in the panel area after transfer and the first error light emitting device 160E1 emits red light, among shared light emitting devices adjacent to the first error light emitting device 160E1, a fifth shared light emitting device 160c5 capable of emitting red light can function as an auxiliary pixel so that the first main pixel 150M1 can operate as a normal unit pixel.

Accordingly, according to the embodiment, there is a technical effect of reducing the difficulty of panel design and transfer process while significantly improving the yield by arranging the shared semiconductor light emitting device around the main pixel.

Next, FIG. 11B is a second operating example 100MC1-2 of the first shared redundancy structure 100MC1 in the embodiment.

In the embodiment, in the second operating example 100MC1-2 is an example in which the first semiconductor light emitting device R of the first main pixel 150M1 is defective and the third semiconductor light emitting device B of the fourth main pixel 150M4 is defective.

For example, this is a case where the first main pixel 150M1 includes the first error light emitting device 160E1 in the red light emitting area and the fourth main pixel 150M4 includes the second error light emitting device 160E2 in the blue light emitting area.

Among the shared auxiliary pixels in the second operating example 100MC1-2 of the embodiment, among the shared auxiliary pixels, the fifth shared light emitting device 160c5 capable of emitting red among the shared light emitting devices adjacent to the first error light emitting device 160E1 functions as an auxiliary pixel, so the main pixel 150M1 can operate as a normal unit pixel.

Also, among the shared auxiliary pixels, the seventh shared light emitting device 160c7 capable of emitting blue among the shared light emitting devices adjacent to the second error light emitting device 160E2 functions as an auxiliary pixel, so the fourth main pixel 150M4 can operate as a normal unit pixel.

Accordingly, according to the embodiment, there is a technical effect of significantly reducing the difficulty of panel design and transfer process while significantly improving the yield by arranging the shared semiconductor light emitting device around the main pixel.

Next, FIG. 11C is a third operational example 100MC1-3 of the first shared redundancy structure 100MC1 in the embodiment.

In the third operating example 100MC1-3, the entire first main pixel 150M1 is defective. For example, the third operating example 100MC1-3 is an example including a first error light emitting device 160E1, a second error light emitting device 160E2, and a third error light emitting device 160E3 in which the first semiconductor light emitting device R emitting red, the second semiconductor light emitting device G emitting green, and the third semiconductor light emitting device B of the first main pixel 150M1 emitting blue are all defective.

In the third operating example 100MC1-3 of the embodiment, among shared auxiliary pixels, among shared light emitting devices adjacent to the first error light emitting device 160E1, a fifth shared light emitting device 160c5 capable of emitting red light can function as an auxiliary pixel.

Also in the third operating example 100MC1-3 of the embodiment, among shared auxiliary pixels, a fourth shared light emitting device 160c4 capable of emitting green light among shared light emitting devices adjacent to the second error light emitting device 160E2 can function as an auxiliary pixel.

In the third operating example 100MC1-3 of the embodiment, among shared auxiliary pixels, among shared light emitting devices adjacent to the third error light emitting device 160E3, the second shared light emitting device 160c2 capable of emitting blue light can function as an auxiliary pixel.

Accordingly, according to the embodiment, a shared semiconductor light emitting device is disposed around the main pixel so that even when one main pixel itself is defective, the corresponding main pixel operates as a normal unit pixel through the shared auxiliary pixel, there is a technical effect that can significantly reduce the difficulty of panel design and transfer process while significantly improving yield.

Next, FIG. 11D is a fourth operational example 100MC1-4 of the first shared redundancy structure 100MC1 in the embodiment.

In the embodiment, the fourth operating example 100MC1-4 is an example in which all of the first main pixels 150M1 are defective and all of the third main pixels 150M3 are defective.

For example, in the embodiment, the third operating example 100MC1-3 is an example including a first error light emitting device 160E1, a second error light emitting device 160E2, and a third error light emitting device 160E3 in which the first semiconductor light emitting device R emitting red, the second semiconductor light emitting device G emitting green, and the third semiconductor light emitting device B of the first main pixel 150M1 emitting blue are all defective.

Also, in the embodiment, the third operating example 100MC1-3 is an example in which the entire third main pixel 150M3 is defective. The third operating example includes the fourth error light emitting device 160E4, the fifth error light emitting device 160E5, and the sixth error light emitting device 160E6 in which the first semiconductor light emitting device R emitting red, the second semiconductor light emitting device G emitting green, and the third semiconductor light emitting device B emitting blue of the third main pixel 150M3 are all defective.

In the fourth operating example 100MC1-4 of the embodiment, since the fifth shared light emitting device 160c5 adjacent to the first error light emitting device 160E1 functions as an auxiliary pixel, the fourth shared light emitting device 160c4 adjacent to the second error light emitting device 160E2 functions as an auxiliary pixel, and the second shared light emitting device 160c2 adjacent to the third error light emitting device 160E3 functions as an auxiliary pixel, the first main pixel 150M1 can function as a normal unit pixel.

Also in the Example, in the fourth operating example 100MC1-4, among shared auxiliary pixels, a ninth shared light emitting device 160c9 capable of emitting red among shared light emitting devices adjacent to the fourth error light emitting device 160E4 can function as an auxiliary pixel.

Also, in the embodiment, in the fourth operating example 100MC1-4, among shared auxiliary pixels, an eighth shared light emitting device 160c8 capable of emitting green light among shared light emitting devices adjacent to the fifth error light emitting device 160E5 can function as an auxiliary pixel.

In the embodiment, in the fourth operating example 100MC1-4, among the shared auxiliary pixels, the sixth shared light emitting device 160c6 capable of emitting blue among the shared light emitting devices adjacent to the sixth error light emitting device 160E6 can functions as an auxiliary pixel.

Accordingly, according to the embodiment, a shared semiconductor light emitting device is disposed around the main pixel so that the main pixel operates as a normal unit pixel through the shared auxiliary pixel even when the two main pixels themselves are defective, there is a technical effect that can significantly reduce the difficulty of panel design and transfer process while significantly improving yield.

INDUSTRIAL APPLICABILITY

The semiconductor light emitting device according to the embodiment is not limited to the micro LED, and includes a mini LED.

The semiconductor light emitting device according to the embodiment can be applied to an LED having a relatively large area for illumination and signage also to the micro LED display.

Also, the display device including the semiconductor light emitting device according to the embodiment can include a Digital TV, a mobile phone, a smart phone, a laptop computer, a digital broadcasting terminal, a personal digital assistants (PDA), a portable multimedia player (PMP), a Navigation, a Slate PC, a Tablet PC, an Ultra-Book, a Desktop Computer, etc.

The above description is merely an example of the technical idea of the embodiment, and those skilled in the art to which the embodiment belongs can make various modifications and variations without departing from the essential characteristics of the embodiment.

Therefore, the embodiments disclosed in the embodiments are not intended to limit the technical idea of the embodiment but to explain, and the scope of the technical idea of the embodiment is not limited by these examples.

The protection scope of the embodiment should be interpreted according to the claims below, and all technical ideas within the scope equivalent thereto should be construed as being included in the scope of rights of the embodiment.

The invention claimed is:

1. A transfer device for semiconductor light emitting devices, the transfer device comprising:
   a line beam laser generator; and
   a through-type glass mask disposed on a semiconductor substrate comprising a predetermined semiconductor light emitting device,
   wherein a line beam laser generated by the line beam laser generator passes through the through-type glass mask to selectively transfer the predetermined semiconductor light emitting device on the semiconductor substrate onto a predetermined panel substrate,
   wherein the through-type glass mask comprises a plurality of spaced apart through-type glass patterns in regions corresponding to the semiconductor light emitting devices, and
   wherein a first width of a region of the through-type glass pattern into which the line beam laser is incident is greater than a second width of a region from which the line beam laser exits.

2. The transfer device for semiconductor light emitting devices according to claim 1, wherein the through-type glass mask comprises a light-blocking glass layer and a light reflecting metal layer disposed under the light-blocking glass layer, and
   wherein a first through-type glass pattern is formed by penetrating the light-blocking glass layer and the light reflecting metal layer in a region corresponding to the predetermined semiconductor light emitting device.

3. The transfer device for semiconductor light emitting devices according to claim 1, wherein a size of the through-type glass mask is greater than a size of a first panel region onto which the predetermined semiconductor light emitting device is transferred.

4. The transfer device for semiconductor light emitting devices according to claim 1, wherein the through-type glass mask comprises an inclined through-type glass pattern.

5. The transfer device for semiconductor light emitting devices according to claim 4, wherein the through-type glass mask comprises a reflective layer disposed on an inclined surface of the inclined through-type glass pattern.

6. The transfer device for semiconductor light emitting devices according to claim 5, wherein the reflective layer is disposed on a first inclined surface where the where a light-blocking glass layer is etched.

7. The transfer device for semiconductor light emitting devices according to claim 6, wherein the reflective layer is also disposed on the first inclined surface where the light-blocking glass layer is etched and a first inclined surface where a light reflecting metal layer is etched.

8. The transfer device for semiconductor light emitting devices according to claim 2, wherein a width of a lower surface of the light reflecting metal layer is greater than a width of a lower surface of the light-blocking glass layer.

9. The transfer device for semiconductor light emitting devices according to claim 2, wherein a width of a lower surface of the light-blocking glass layer is equal to a width of an upper surface of the light reflecting metal layer.

10. The transfer device for semiconductor light emitting devices according to claim 2, wherein an angle of an inclined surface of the light-blocking glass layer is the same as that of an inclined surface of the light reflecting metal layer.

11. The transfer device for semiconductor light emitting devices according to claim 2, wherein the light-blocking glass layer is selected from the group consisting of borosilicate glass, germanium glass, acrylic glass, UV grade fused silica glass, and semiconductor grade fused quartz.

12. The transfer device for semiconductor light emitting devices according to claim 2, wherein the light reflecting metal layer comprises a material selected from the group consisting of Al, Ag, Ni, Ti, and alloys thereof.

13. The transfer device for semiconductor light emitting devices according to claim 2, wherein the light reflecting metal layer comprises a metal reflective layer and a dielectric layer.

14. The transfer device for semiconductor light emitting devices according to claim 5, wherein the reflective layer disposed on the inclined surface comprises a material selected from the group consisting of Al, Ag, Ni, Ti, alloys thereof, and a dielectric material.

15. The transfer device for semiconductor light emitting devices according to claim 5, wherein the reflective layer is formed on at least part of the inclined surface of the inclined through-type glass pattern.

16. The transfer device for semiconductor light emitting devices according to claim 1, wherein the predetermined semiconductor light emitting device comprises a micro-LED or a mini-LED.

* * * * *